United States Patent
Howard et al.

(10) Patent No.: US 6,909,125 B2
(45) Date of Patent: Jun. 21, 2005

(54) IMPLANT-CONTROLLED-CHANNEL VERTICAL JFET

(75) Inventors: Gregory E. Howard, Dallas, TX (US); Leland S. Swanson, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 56 days.

(21) Appl. No.: 10/614,840

(22) Filed: Jul. 8, 2003

(65) Prior Publication Data

US 2005/0006663 A1 Jan. 13, 2005

(51) Int. Cl.[7] .................... H01L 29/74; H01L 31/111
(52) U.S. Cl. ............................ 257/134; 257/135
(58) Field of Search ............................ 257/134, 135, 257/133, 302, 256

(56) References Cited

U.S. PATENT DOCUMENTS

| | | | | |
|---|---|---|---|---|
| 6,049,108 A | * | 4/2000 | Williams et al. | 257/341 |
| 6,392,271 B1 | * | 5/2002 | Alavi et al. | 257/328 |
| 6,518,112 B2 | * | 2/2003 | Armacost et al. | 438/212 |
| 6,825,531 B1 | * | 11/2004 | Mallikarjunaswamy | 257/343 |

OTHER PUBLICATIONS

Pending U.S. Appl. No. 10/678,028 (TI–33654), Pendharkar et al. "A Low Noise Vertical Variable Gate Control Voltage JFET Device in a BICMOS Process & Methods to Build this Device".

Pending U.S. Appl. No. 10/623,230 (TI–35213), Howard et al. "Double Diffused Vertical JFET".

* cited by examiner

Primary Examiner—Phat X. Cao
Assistant Examiner—Theresa T. Doan
(74) Attorney, Agent, or Firm—Yingsheng Tung; Wade James Brady, III; Frederick J. Telecky, Jr.

(57) ABSTRACT

We disclose the structure of an electronic device, the method of making the device and the operation of the device. The device is built near the top of a substrate. It has, near the top surface, a buried layer that is electrically communicable to a drain terminal. The device has a body region over the buried layer. A portion of the body region contacts a gate region connected to a gate terminal. The device has a channel region, of which the length spans the distance between the buried layer and a source region, which projects upward from the channel region and is connected to a source terminal. The device current flows in the channel substantially perpendicularly to the top surface of the substrate.

23 Claims, 5 Drawing Sheets

IMPLANT-CONTROLLED-CHANNEL VERTICAL JFET

BACKGROUND OF THE INVENTION

This invention relates to semiconductor devices and particularly to an improved junction field effect transistor (JFET).

A conventional JFET is a three-terminal semiconductor device in which a current flowing substantially parallel to the top surface of the semiconductor chip is controlled by an externally applied vertical electric field, as shown in FIG. 1a, 1b, and 1c. It can be used as a switch or an amplifier. JFET is known as the unipolar transistor because the current is transported by carriers of one polarity, namely, the majority carriers. This is in contrast with the bipolar junction transistor, in which both majority-and-minority-carrier currents are important.

A typical n-channel JFET fabricated by the standard planar process is shown in FIG. 1. FIG. 1a depicts a JFET built in a semiconductor substrate in an epitaxial layer. FIG. 1b depicts a JFET fabricated by a double-diffused technique in a bulk semiconductor substrate. FIG. 1c is a schematic representation of both JFETs.

The active region of the JFET consists of a lightly doped n-type channel sandwiched between two heavily doped $p^+$-gate regions. In FIG. 1a, the lower $p^+$ region is the substrate, and the upper $p^+$ region is formed by boron diffusion into the epitaxially grown n-type channel. The $p^+$ regions are connected either internally or externally to form the gate terminal. Ohmic contacts attached to the two ends of the channel are known as the drain and source terminals through which the channel current flows. Alternatively, the JFET may be fabricated by the double-diffused technique with a diffused channel and an upper gate as illustrated in FIG. 1b. In both cases, the channel and the gate regions run substantially parallel the top surface of the substrate, so does the current flow in the channel.

When a JFET operates as a switch, without a gate bias voltage, the transistor has a conducting channel between the source and the drain terminals. This is the ON state. To reach the OFF state, a reverse-biasing gate voltage is applied to deplete all carriers in the channel.

The reverse voltage bias applied across the gate/channel junctions depletes free carriers from the channel and produces space-charge regions extending into the channel. With a gate voltage set between ON and OFF levels, the cross-sectional area of the channel and the channel resistance can be varied. Thus the current flow between the source and the drain is modulated by the gate voltage.

An important figure of merit of a JFET is its cutoff frequency ($f_{co}$), which can be represented mathematically as follows:

$$f_{co} \leq qa^2 \mu_n N_d / (4\pi k \in_o L^2),$$

where q is the electric charge of the charge carriers, a is the channel width, $\mu_n$ is the mobility of the charge carriers, $N_d$ is the doping concentration in the channel, k and $\in_o$ are the dielectric constant and the electrical permittivity of the semiconductor material and the free space respectively, and L is the channel length.

Another important figure of merit of a JFET is the noise figure. At lower frequencies the dominant noise source in a transistor is due to the interaction of the current flow and the surface region that gives rise to the 1/f noise spectrum.

This invention provides a JFET device that has superior $f_{co}$ and 1/f performance over conventional JFETs and a process of making the device.

DESCRIPTION OF THE PREFERRED EMBODIMENT

Figure 2:
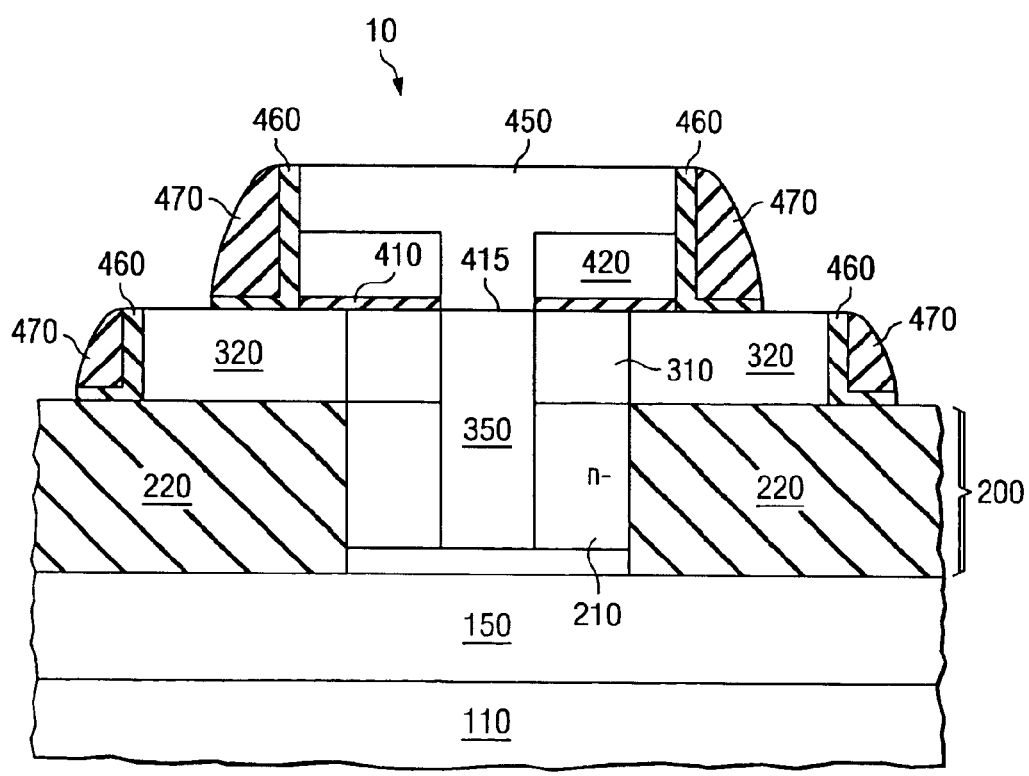
FIG. 2 is a partial sectional depiction of a semiconductor substrate with a JFET embodying the invention built in it.

In FIG. 2, an n-channel JFET 10 is shown as a three-terminal device, fabricated near the surface of a semiconductor substrate surface. The semiconductor material in the preferred embodiment is silicon. A JFET embodying this invention can also be fabricated in other semiconductor materials such as germanium, germanium-silicon, gallium arsenide or other compound material. FIG. 2 depicts a JFET built in a bulk silicon substrate. A JFET embodying this invention can also be fabricated in a substrate of semiconductor-on-insulator such as SIMOX, silicon-on-sapphire, or in bonded wafer. FIG. 2 depicts an n-channel JFET. A JFET embodying this invention can also be implemented as a p-channel JFET. A JFET may also be one device in an integrated circuit that includes CMOS and Bipolar circuit elements, and passive circuit components.

The substrate 110 may be either n-type or p-type. In a typical integrated circuit fabricated by a BiCMOS process, the substrate 110 would be a lightly doped, p-type crystalline silicon material. Over a portion of the substrate 110 is an n-type layer 150 of low resistivity that constitutes the drain portion of the JFET. In a BiCMOS structure, a region commonly referred to as "a buried layer" fits this requirement.

Over a portion of the buried layer 150 is layer 200. Layer 200 includes several regions of different materials. Among them, region 220 includes primarily dielectric material. In this embodiment, this material is silicon dioxide, fabricated with a STI technique. Region 220 may also be built with a LOCOS technique or other techniques well known in the art. Element 210 of layer 200 is substantially p-type monocrystalline silicon. It may be formed by an epitaxial technique.

Elements 320 are gate regions of the JFET, located above layer 200. They are polycrystalline silicon, heavily doped with p-type dopant. A portion of the p-type dopant diffuses into the adjacent lightly doped p-region 310, which is mono-crystalline. The combination of elements 310 and 210 makes up a mono-crystalline region that contains the channel region 350 of the JFET.

The channel may be created by implanting n-type ions perpendicular to the substrate surface. The dopant concentration in the channel region is usually not uniform. In fact, it is advantageous to be able to tailor the doping profile, for example, so that the dopant concentration in the channel region near the surface of the substrate is lower than the dopant concentration distant from the surface of the substrate. This dopant profile places the pinch-off region closer to the top of layer 310 and uses the shallow portion of the implanted ions to set the pinch-off voltage of the JFET. Such a profile may be accomplished with a multiple-implant process. The multiple implants may be of various dosages and implant energies. In this embodiment, we employ a three-implant process—one at 220 keV, one at 340 keV and one at 500 keV.

The source region 450 in this embodiment is polycrystalline. It makes contact to the channel region 350 through an opening 415 etched out through an insulating element that comprises a silicon dioxide element 410 and a silicon nitride element 420. In the preferred embodiment, there is an absence of native oxide between the source region 450 and the channel region 350 so the source region contacts the channel region and the silicon immediately above the channel region may retain the mono-crystalline structure within a short range. In another embodiment, minute oxide may exist in the vicinity of the opening 450 as result of chemical processes such as a wet chemical cleanup process. The source region 450 is heavily doped with phosphorus, arsenic, or other n-type dopants and it partially overhangs the gate regions 320 and is insulated from the gate region 320 by silicon dioxide elements 410, silicon nitride elements 420, oxide elements 460 and nitride elements 470.

FIGS. 3 to 7 depict the channel portion of a JFET embodying this invention through a fabrication process. The complete fabrication of a functional JFET, in the context of an integrated circuit, involves many well-known processes in addition to those illustrated in the drawings. These well-known processes include creating a drain contact to the buried layer, a source contact to the source region, and a gate contact to the gate region, and wiring the contacts with metallic elements to connect the JFET to the other circuit elements of the integrated circuit.

Figure 3:
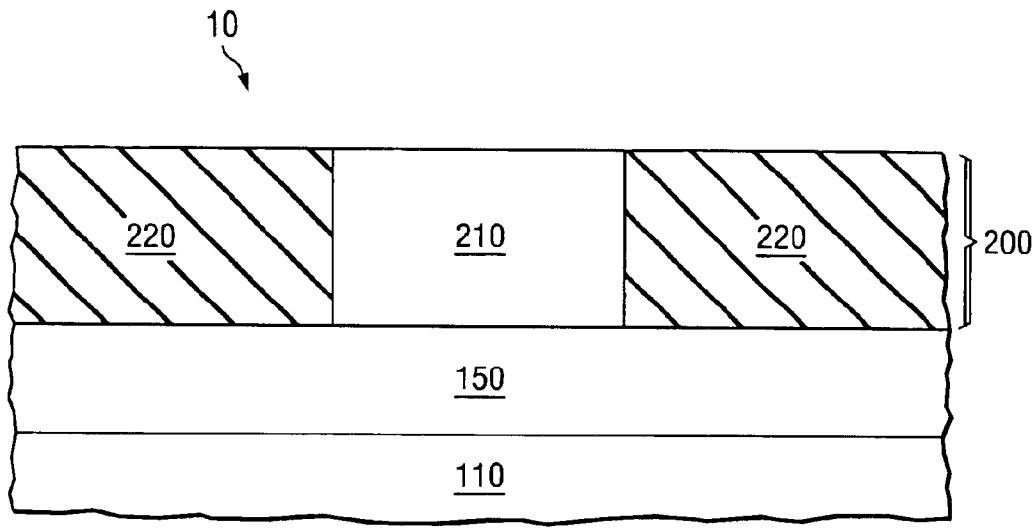
FIG. 3 is a cross-sectional depiction of a partially completed JFET 10 embodying this invention.

FIG. 3 depicts a cross-sectional view of a partially completed JFET 10 embodying this invention. Element 110 is a semiconductor substrate. In this embodiment, the semiconductor material is silicon. Other semiconductor materials suitable to implement this invention include germanium, silicon-germanium, silicon carbide, and gallium arsenide. In this embodiment, the silicon substrate is a bulk substrate. Other type of substrate suitable to implement this invention includes silicon on insulator (SOI).

Substrate 110 may be doped with a p-type or n-type dopants. The dopant concentration may vary from light to heavy as understood by a person with reasonable skill in the art of semiconductor processing.

Element 150 is a heavily doped semiconductor layer partially covering the substrate 110. In this embodiment, layer 150 is formed by an arsenic or phosphorus implant step followed by a anneal step. In the art of semiconductor processing, this heavily doped region is referred to as "a buried layer".

Layer 200 sits on top of the buried layer. In this embodiment, layer 200 is an epitaxial, lightly doped, p-type mono-crystalline-silicon layer. The thickness of this epi-layer may be between 2000 Å and 7000 Å, preferably about 5000 Å. Layer 200 may be doped in-situ. It may also be doped with a boron implant with a dose between $5 \times 10^9$ to $5 \times 10^{11}$ ions/cm$^2$, to a dopant concentration of about $1 \times 10^{15}$ ions/cm$^3$.

Layer 200 also includes regions of dielectric material to insulate the JFET electrically from the adjacent circuit elements. The dielectric regions 220 are places in the layer 200 such that the JFET is formed in a mono-crystalline silicon island 210. In this embodiment, the dielectric material is silicon dioxide and the technique with which the silicon dioxide regions are formed is referred to in the art as the shallow trench isolation (STI) technique.

Figure 4:
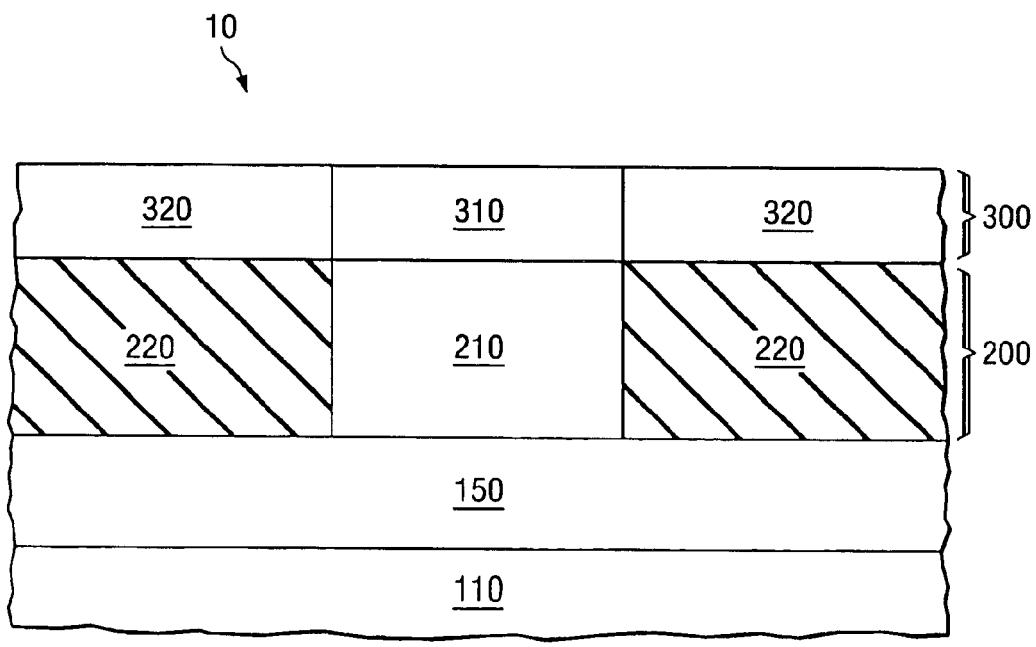
FIG. 4 is a cross-sectional depiction of a further partially completed JFET 10 embodying this invention.

FIG. 4 depicts a cross-sectional view of a further partially completed JFET 10. Features depicted in FIG. 4 include a layer element 300. In this embodiment, layer 300 is another lightly doped, p-type, silicon-epi-layer. The thickness of layer 300 may be between 1000 Å and 3000 Å, preferably 2000 Å. Layer 300 may be doped in-situ or it maybe doped with a boron implant with dose between $5 \times 10^9$ and $5 \times 10^{11}$ ions/cm$^2$, preferably to a dopant concentration of about $1 \times 10^{15}$ ions/cm$^3$.

The portion of epi-layer 300 that is in contact with element 210 is mono-crystalline while the portion that contacts element 220 is poly-crystalline.

Figure 5:
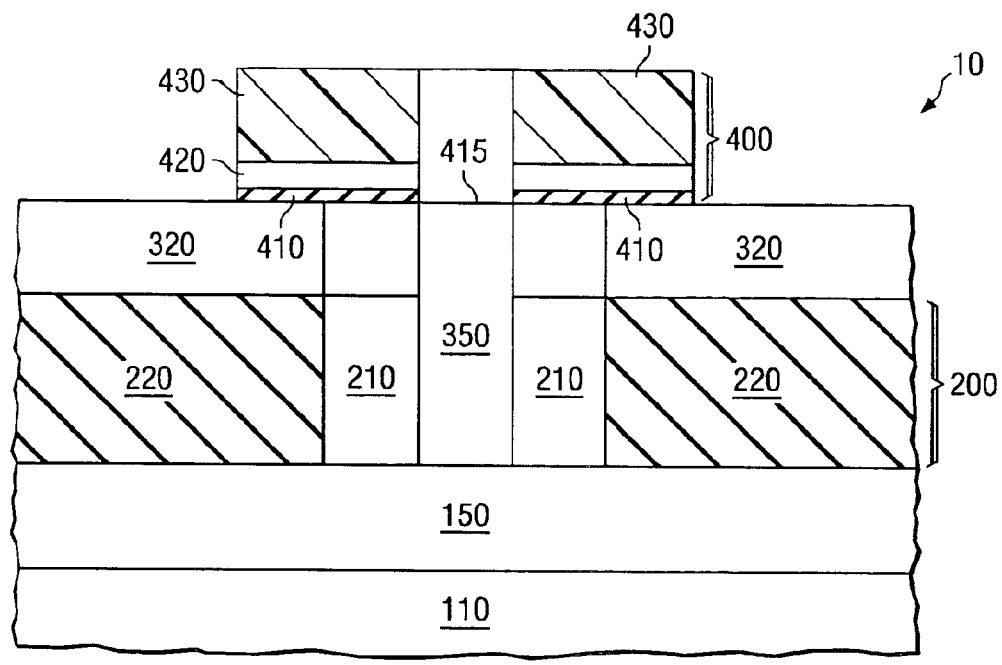
FIG. 5 is a cross-sectional depiction of a further partially completed JFET 10 embodying this invention.

FIG. 5 depicts a cross-sectional view of yet a further partially completed JFET 10 embodying this invention. Features depicted in FIG. 5 include a region 350 enclosed in the region 210, and a layer 400 that comprises a patterned photoresist layer 430, a silicon nitride layer 420, and a silicon dioxide layer 410. The nitride and oxide layers are depicted in FIG. 5 as after a portion, uncovered by the photoresist pattern 430, has been removed by an etching technique well known in the art of semiconductor processing. The etched portion includes a region 415. Instead of a silicon-nitride, silicon oxide layer combination in layer 400, the JFET may also be fabricated by using a single oxide layer, or nitride layer, or oxynitride layer.

The region 350 is the n-channel region of the JFET, it maybe formed by implanting n-type ions into region 210 through the opening 415. In this embodiment, the channel is formed with a three-step ion-implant process. One implant is at 200 keV, another implant is at 340 keV, and another implant is at 500 keV. Dosages of phosphorus ions that may range from $2 \times 10^9$ to $4 \times 10^{11}$ ions/cm$^2$ per implant are used in the 3-step implant—with the higher energy implants typically associate with higher doses. Other n-type ion species and implant dosages and energies may also be used to tailor the channel doping profile to suit specific circuit requirement.

Figure 6:
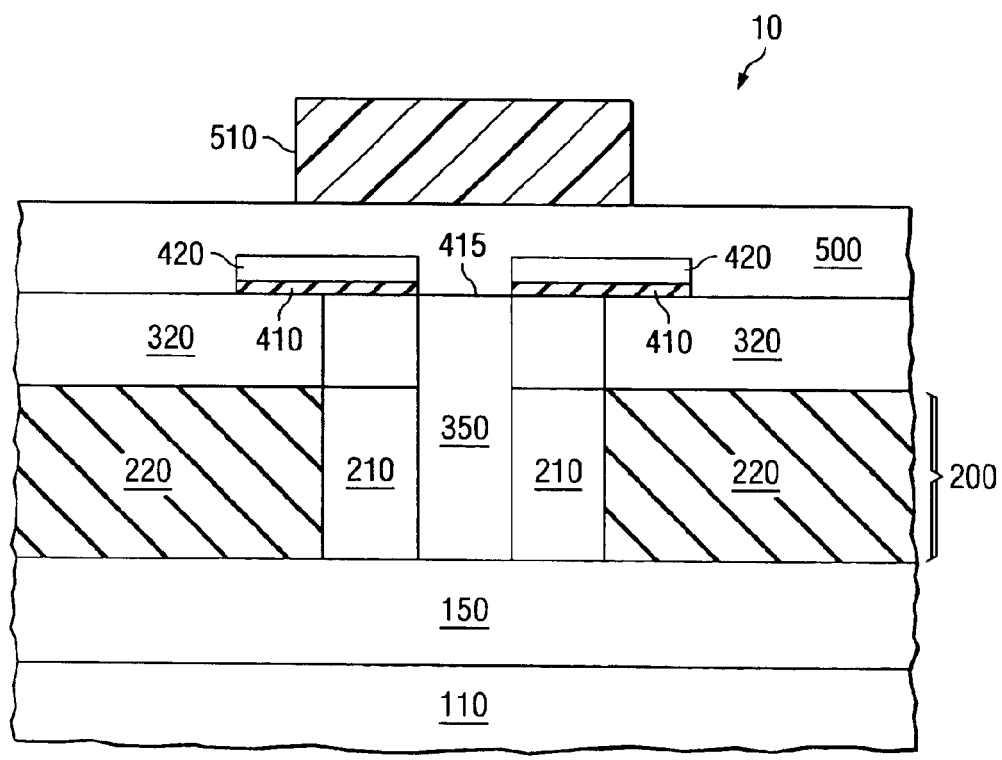
FIG. 6 is a cross-sectional depiction of a further partially completed JFET 10 embodying this invention.

FIG. 6 depicts a cross-sectional view of yet a further partially completed JFET 10 embodying this invention. Features depicted in FIG. 6 include a layer element 500. In this embodiment, the layer 500 is polysilicon, with a thickness between 1 kÅ and 3 kÅ. At the vicinity of opening 415, where layer 500 contacts channel 350, the crystal may follow the structure of the channel region and remains mono-crystalline.

FIG. 6 also depicts a photoresist pattern 510. This pattern defines the source electrode area and the gate electrode area, as will be further illustrated in FIG. 7.

Figure 7:
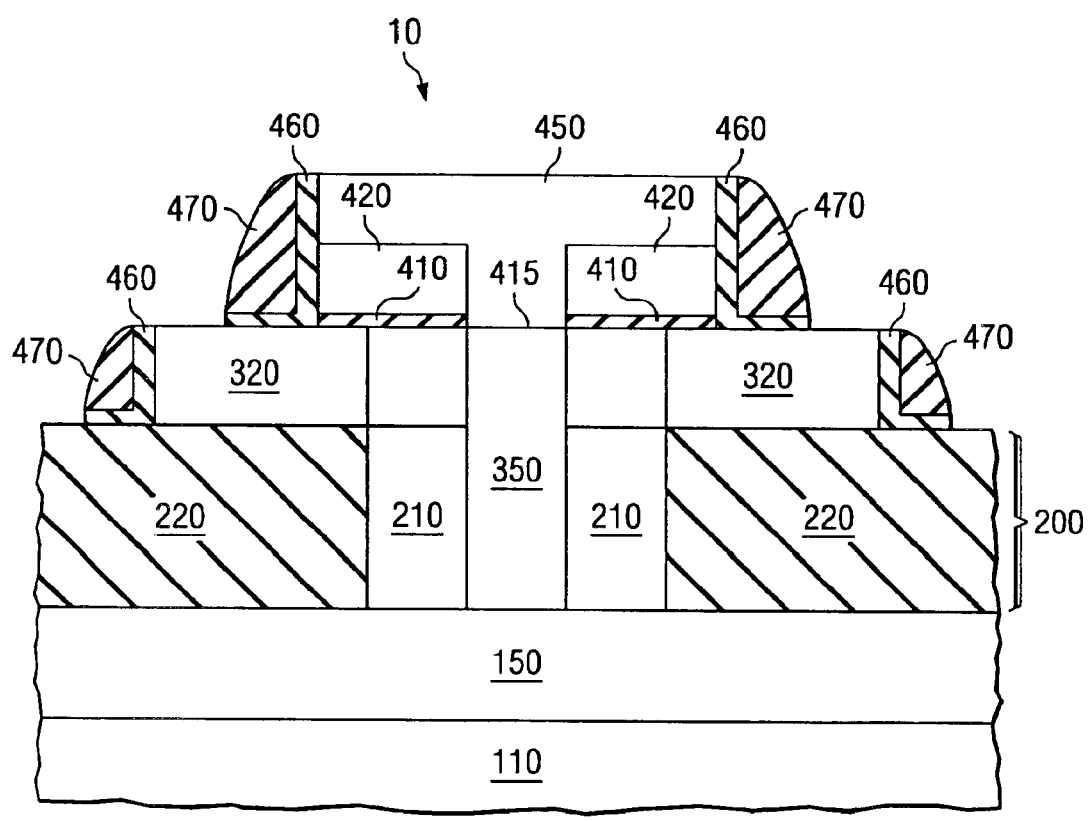
FIG. 7 is a cross-sectional depiction of a further partially completed JFET 10 embodying this invention.

FIG. 7 depicts a cross-sectional view of yet a further partially completed JFET 10 embodying this invention. Features depicted in FIG. 7 include a source element 450, a gate element 320, and sidewall elements 460 and 470.

In this embodiment, the source element 450 and the gate element 320 are formed with a poly etch process well known in the art of semiconductor processing. The etching action removes the portion of layer 500 that is not protected by the photoresist pattern 510 and the portion of layer 300 that is not protected by oxide element 410 and nitride element 420. Element 470 and element 460 are referred in the art of semiconductor processing as the sidewalls. They are formed by a technique combining a film deposition and a film etching. The etching action not only removes the newly deposited film but also a portion of the oxide element 410 and nitride element 420 that is not covered by the source element 450 or the sidewall elements 460 and 460. At the completion of the etching process, the silicon surfaces of the source element 450 and the gate element 320 are uncovered.

FIG. 7 also depicts the source and gate implant processes. In this embodiment, the gate-implant species is boron, the dose is $3\times10^{15}$ ions/cm$^2$, and the implant energy is 20 keV. The source implant species is arsenic, the dose is $1.5\times10^{15}$ ions/cm$^2$, and the implant energy is 50 keV. Other implant species, dosages and energies maybe used to effect low resistivity in the source and gate-poly-regions.

Figure 1A:
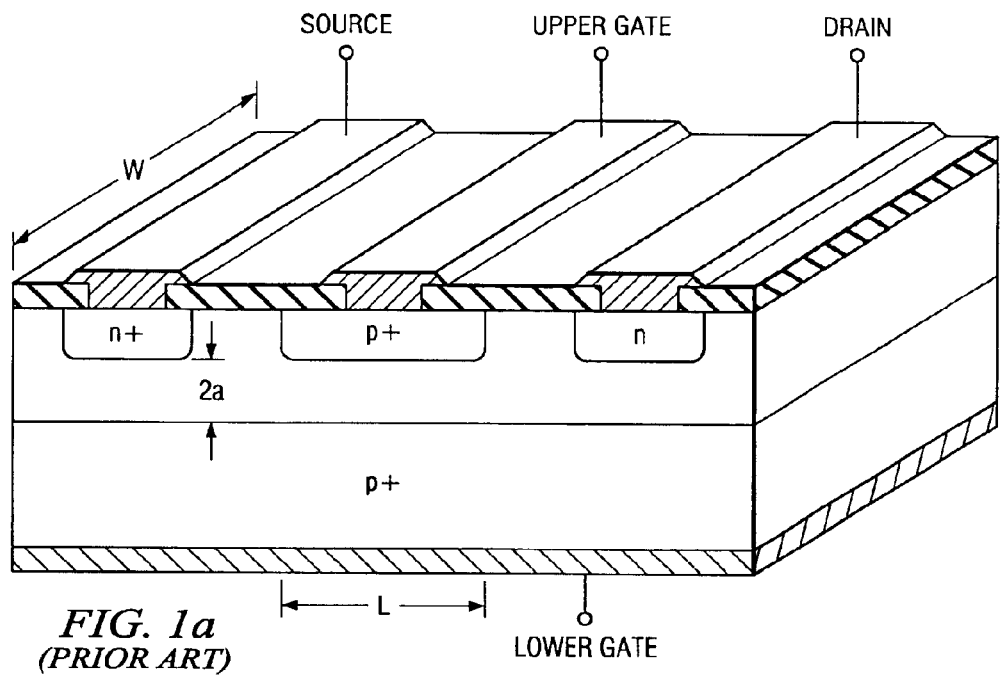
FIG. 1a is a partial sectional depiction of a semiconductor substrate with a JFET device built in it.
Figure 1B:
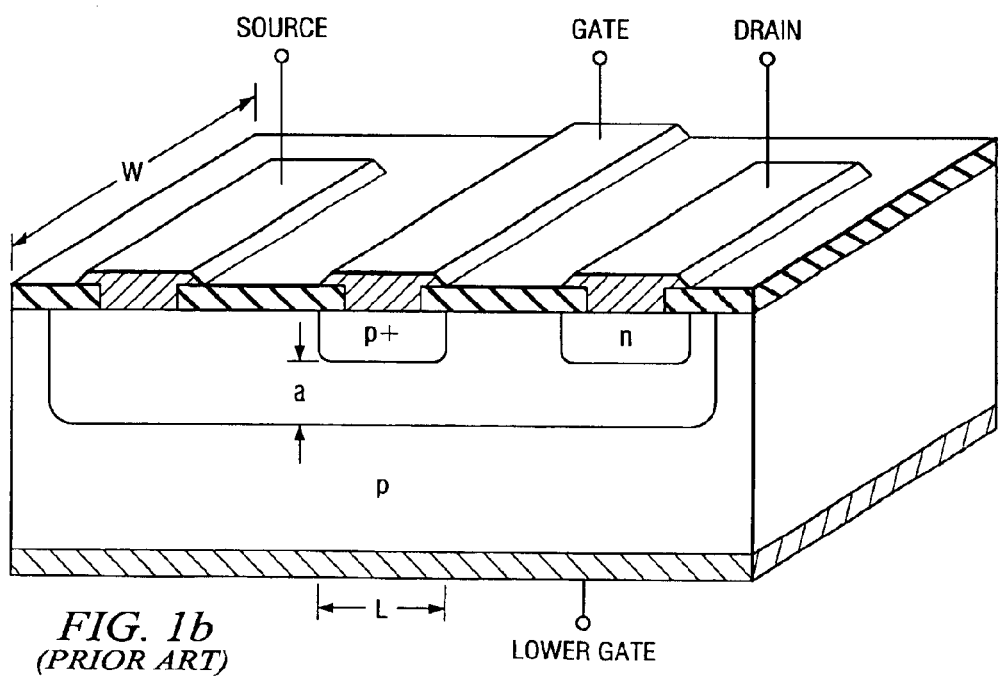
FIG. 1b is a partial sectional depiction of a semiconductor substrate with another JFET device built in it.
Figure 1C:
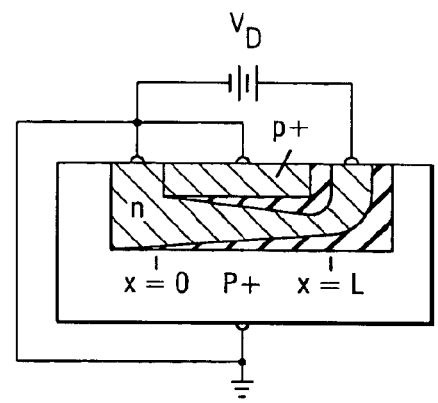
FIG. 1c is a schematical representation of a JFET.

Contrary to conventional JFETs, as depicted in FIGS. 1$a$, 1$b$, and 1$c$, which have their channel substantially parallel and proximate to the top surface of the semiconductor substrate, the JFET embodying this invention has a "vertical" channel.

It is well known in the art of semiconductor physics that the top surface of the semiconductor substrate is heavily populated with imperfections such as charge traps and surface states. The interaction between the charge carrier in the channel and the surface imperfections is partially responsible for the performance limitation of conventional semiconductor devices in which the current flows parallel to and near the surface.

In contrast, the "vertical" channel in the present invention channels the flow of the charge carriers in a direction substantially perpendicular to the "surface" of the semiconductor surface. Thus the interaction between the charge carrier and the surface imperfection is substantially reduced, which enables the JFETs embodying this invention to have superior cutoff frequency ($f_{co}$) and 1/f noise figure.

What is claimed is:

1. An electronic device, comprising
   a. a substrate, having a top surface and a bottom surface;
   b. a buried layer near the top surface, electrically communicable to a drain terminal;
   c. a body region, having a second top surface, a second bottom surface and a second side surface, a portion of the side surface contacting a gate region communicable to a gate terminal;
   d. a channel region, having a third top surface, a third bottom surface, and a third side surface, the third side surface contacting the body region, the third bottom surface being substantially coplanar to the second bottom surfaces and contacting the buried layer, the third top surface being substantially coplanar to the second top surface and electrically communicable to a source region; and
   e. the source region, projecting upward from the channel region, electrically communicable to a source terminal.

2. The electronic device in claim 1 in which the substrate is a semiconductor material.

3. The electronic device in claim 2 in which the semiconductor material is p-type silicon.

4. The electronic device in claim 1 in which the buried layer is n-type silicon material communicable to a drain terminal near the top surface through a sinker.

5. The electronic device in claim 1 in which the body region comprises two layers of substantially mono-crystalline p-type silicon layers.

6. The electronic device in claim 1 in which a portion of the body region contacts a dielectric region.

7. The electronic device in claim 6 in which the dielectric region comprises a silicon dioxide region formed with a STI technique.

8. The electronic device in claim 1 in which the channel region comprises of three groups of n-type dopant ions distributed along a direction perpendicular to the top surface of the substrate.

9. The electronic device in claim 1 in which the dopant ion distribution in the channel region is lighter near the source region than near the drain region.

10. The electronic device in claim 1 in which the gate region is substantially p-type polycrystalline silicon.

11. The electronic device in claim 1, in which an electrical current flows in the channel region upon a voltage bias being applied between the source terminal and the drain terminal.

12. The electronic device in claim 11, in which the electrical current flows in a direction substantially perpendicular the top surface of the substrate.

13. The electronic device in claim 11, in which the magnitude of the current is a function of a voltage at the gate terminal.

14. The electronic device in claim 1, in which the channel region is doped with n-type dopant.

15. The electronic device in claim 1, in which the channel region is doped with p-type dopant.

16. A semiconductor integrated circuit device, comprising
   a. a semiconductor substrate, having a top surface and a bottom surface;
   b. a buried layer of crystalline semiconductor material near the top surface, doped with a dopant of a first polarity, electrically communicable to a drain terminal near the top surface;
   c. a mono-crystalline first region, doped with dopant of the first polarity, having a top surface, a bottom surface and a side surface, the lower portion of the side surface contacting an electrically insulating region and the upper portion of the side surface coupling to a gate region communicable to a gate terminal near the top surface of the substrate;
   d. a channel region, doped with dopant of a second polarity, having a top surface, a bottom surface, and a side surface, the top surface being substantially coplanar to the top surface of the first region, the bottom surface being substantially coplanar to the bottom surfaces of the first region and electrically communicable to the buried layer, the side surface contacting the first region; and
   e. a source region, projecting upward from the channel region, having a top surface electrically communicable to a source terminal, a bottom surface electrically communicable to the top surface of the channel region.

17. The electronic device in claim 16, in which an electrical current flows in the channel region upon a voltage bias being applied between the source terminal and the drain terminal.

18. The electronic device in claim 17, in which the electrical current flows in a direction substantially perpendicular the top surface of the substrate.

19. The electronic device in claim 17, in which the magnitude of the current is a function of a voltage at the gate terminal.

20. The electronic device in claim 16, in which the distance between the top surface and the bottom surface of the channel region is about 0.7 micro-meters, in which about 0.5 micro-meter is attributable to a bottom layer and about 0.2 micro-meters is attributable to a top layer.

21. The electronic device in claim 16, in which the dopant of a first polarity is p-type.

22. The electronic device in claim 16, in which the dopant of a first polarity is n-type.

23. An n-channel silicon JFET, comprising
   a. a silicon substrate, having a top surface and a bottom surface;
   b. a buried layer of mono-crystalline silicon near the top surface, doped with a n-type dopant to a sheet resistance of about 25 ohms per square, the buried layer being electrically communicable to a drain terminal near the top surface of the substrate;
   c. a silicon mono-crystalline first region, doped with p-type dopant to a concentration of about $1\times10^{15}$ dopant ions per cubic centimeter, having a top surface, a bottom surface and a side surface, the distance between the top and the bottom surfaces being about 0.7 micrometers, the lower portion of the side surface being in contact with a silicon dioxide region and the upper portion of the side surface being in contact with a p-type, poly-crystalline silicon gate region;
   d. the silicon gate region being communicable to a gate terminal near the top surface of the substrate;
   e. an n-type silicon mono-crystalline-channel region, doped with n-type dopant to a concentration higher than about $1\times10^{15}$ dopant ions per cubic centimeter, having a top surface, a bottom surface, and a side surface, the top surface being substantially coplanar to the top surface of the p-type first region, the bottom surface being substantially coplanar to the bottom surfaces of the p-type region in c and electrically communicable to the buried layer, the side surface contacting the p-type first region;
   f. a first n-type, poly-crystalline-silicon-source region, projecting upward from the channel region and the gate region, having a top surface electrically communicable to a source terminal near the top surface of the substrate, a bottom surface electrically communicable to the top surface of the channel region, a side surface in contact with dielectric sidewall spacers;
   g. the first n-type, poly-crystalline-silicon-source region in f being electrically insulated from the first p-type, poly-crystalline-silicon-gate region.
   h. the device being operable channeling an electrical current through the channel region upon a voltage bias being applied between the source terminal and the drain terminal; and
   i. the electrical current flowing in a direction substantially perpendicular the top surface of the silicon substrate, the magnitude of the electrical current being a function of a voltage at the gate terminal.

* * * * *